(12) United States Patent
Krampitz et al.

(10) Patent No.: US 7,915,856 B2
(45) Date of Patent: Mar. 29, 2011

(54) BATTERY TESTING AND/OR CHARGING SYSTEM WITH INTEGRATED RECEPTACLE AND PASS-THROUGH POWER FOR BOOSTER PACK AND METHOD OF USING SAME

(75) Inventors: Scott Krampitz, Blooming Prairie, MN (US); Kurt Raichle, Owatonna, MN (US); Durval Ribeiro, Owatonna, MN (US)

(73) Assignee: SPX Corporation, Charlotte, NC (US)

( * ) Notice: Subject to any disclaimer, the term of this patent is extended or adjusted under 35 U.S.C. 154(b) by 237 days.

(21) Appl. No.: 11/454,881

(22) Filed: Jun. 19, 2006

(65) Prior Publication Data

US 2007/0210801 A1 Sep. 13, 2007

Related U.S. Application Data (60) Provisional application No. 60/780,837, filed on Mar. 10, 2006.

(51) Int. Cl.
*H02J 7/14* (2006.01)
(52) U.S. Cl. ........ 320/104; 320/103; 320/107; 320/113; 320/137; 324/426

(58) Field of Classification Search .......... 320/104, 320/107, 109, 111, 113, 128, 137, 138, 103; 324/426
See application file for complete search history.

(56) References Cited

U.S. PATENT DOCUMENTS

| | | | | |
|---|---|---|---|---|
| 4,215,306 A * | 7/1980 | Mace | | 320/105 |
| 5,111,127 A * | 5/1992 | Johnson | | 320/101 |
| 6,262,559 B1 * | 7/2001 | Eggert et al. | | 320/103 |
| 6,597,150 B1 * | 7/2003 | Bertness et al. | | 320/104 |
| 2002/0171391 A1 * | 11/2002 | Batts-Gowins | | 320/103 |
| 2003/0011344 A1 * | 1/2003 | Bertness et al. | | 320/103 |
| 2006/0214626 A1 * | 9/2006 | Nilson et al. | | 320/104 |

* cited by examiner

*Primary Examiner* — Edward Tso
*Assistant Examiner* — Arun Williams
(74) *Attorney, Agent, or Firm* — Baker & Hostetler LLP (57) ABSTRACT

A battery testing/charging system includes an execution unit, such as a battery tester/charger, a receptacle configured to receive an external booster pack, and an outlet configured to power the booster pack when the booster pack is connected to the outlet. The receptacle removably receives the booster pack, such that the booster pack can be removed and separately carried when the execution unit is not required. The receptacle may be integrated with the execution unit. Alternatively, the execution unit may be mounted on a cart, and the receptacle integrated with the cart. The cart may also include an accessory storage tray and an output device bracket. The execution unit may receive partial or total power from the booster pack.

16 Claims, 4 Drawing Sheets

BATTERY TESTING AND/OR CHARGING SYSTEM WITH INTEGRATED RECEPTACLE AND PASS-THROUGH POWER FOR BOOSTER PACK AND METHOD OF USING SAME

CROSS-REFERENCE TO RELATED APPLICATIONS

This application claims priority to provisional U.S. patent application entitled, Apparatus and Method for Remote Battery Tester/Charger Control, filed Mar. 10, 2006, having a Ser. No. of 60/780,837, the disclosure of which is hereby incorporated by reference in its entirety.

FIELD OF THE INVENTION

The present invention relates generally to battery chargers and testers/chargers. More particularly, the present invention relates to a battery testing or testing/charging system having an integrated receptacle for a booster pack.

BACKGROUND OF THE INVENTION

Users of battery chargers and tester/chargers are often required to select from a variety of functions that the charger or tester/charger is capable of performing. Many extant devices feature a rotary knob, connected to a mechanical switch that the user turns to select a desired function, with each position of the knob corresponding to a particular function of the device.

Battery chargers and tester/chargers are increasingly incorporating electronic components, with their functions determined and controlled by computer software, such that mechanical switches become less suitable for selecting functions. These software-driven devices and systems often incorporate keypads used to navigate through available options. Alternatively, a continuously rotatable knob or wheel may be used, effectively permitting the user to scroll through the menu of available options. Such user interfaces for software-driven devices and systems have a shortcoming, however, in that keypads and continuously rotatable knobs or wheels do not provide the tactile and visual feedback of mechanical switches.

Further, extant battery charging and testing/charging systems typically incorporate the user interface controls and the battery charger or tester/charger itself into a single enclosure or housing. Since these devices are generally short and squat, the user often needs to bend or stoop over in order to access the controls. Alternatively, the entire unit may be mounted such that the controls are more easily accessible, though this has the undesirable effect of rendering the unit substantially immobile as well as potentially unsightly.

Many traditional battery chargers include a BOOST function usable to provide additional power to a discharged battery. Often, the BOOST function is powered by the internal AC to DC transformer of the battery charger. However, since extant battery charging systems are generally powered via a fixed AC power outlet, use of the BOOST function may be limited to environments where such power is readily available. This, of course, may not be the case for all disabled vehicles. In these cases, a separate battery booster pack must be used to start the vehicle before the vehicle can be moved to the battery testing or testing/charging equipment, thus increasing the time necessary to diagnose the battery. Though an internal, rechargeable battery could be integrated into the battery charger or tester/charger to partially address this shortcoming, this increases the cost of the component.

Accordingly, it is desirable to provide a user interface for selection of items from a menu in a software-driven device that provides the user with the tactile and visual feedback of a mechanical switch. Further, it is desirable to provide a battery charging or testing/charging system with a remote-control user interface. Such a remote-control interface permits separation between the user interface controls and the battery charger or tester/charger itself, such that both components may be in convenient, ergonomically suitable, and aesthetically pleasing positions or locations. Additionally, it is desirable to provide an easily transportable, fully integrated, modular battery charging or testing/charging system capable of use even in locations remote from a permanent power supply.

SUMMARY OF THE INVENTION

The foregoing needs are met, to a great extent, by the present invention, wherein in one aspect an apparatus is provided that in some embodiments provides a battery charging or testing/charging system configured to receive and recharge a removable booster pack capable of partially or totally powering the battery charging or testing/charging system. This, in turn, provides the operator with a single tool usable even at remote locations without the need to integrate a rechargeable battery into the system.

In accordance with one embodiment of the present invention, a battery testing/charging system is provided. The system includes an execution unit, such as a battery tester/charger, a receptacle configured to receive an external booster pack, and an outlet configured to power the booster pack when the booster pack is connected to the outlet. The receptacle removably receives the booster pack, such that the booster pack can be removed and separately carried when the execution unit is not required. The receptacle may be integrated with the execution unit. Alternatively, the execution unit may be mounted on a cart, and the receptacle integrated with the cart. For cart-mounted configurations, the cart may also include an accessory storage tray and an output device bracket. The execution unit may receive partial or total power from the booster pack, thus permitting the use of the execution unit remote from a fixed power supply (i.e., an AC wall outlet).

In another aspect of the present invention, a method of diagnosing a vehicle battery at a remote location is provided. The method includes providing an execution unit, such as a battery tester/charger, providing a portable power supply, such as a booster pack, mounting the execution unit to a transportation device, such as a cart, releasably securing the power supply to a receptacle integrated into one of the execution unit and the transportation device, and performing a battery-related function. In certain aspects, the method includes partially or totally powering the execution unit from the portable power supply. The portable power supply may be recharged through the execution unit when the latter is connected to a fixed power supply, such as an AC wall outlet. The portable power supply may be used directly and independently (that is, removed from the receptacle) to boost the vehicle battery.

In yet another embodiment of the present invention, a battery testing/charging system is provided. The system includes means for executing at least one battery-related function, means for providing power to at least one of the executing means and a vehicle battery, and means for transporting the executing means and the power providing means.

The system also includes means for removably securing the power providing means to one of the executing means and transporting means, as well as means for charging the power providing means.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION

The invention will now be described with reference to the drawing figures, in which like reference numerals refer to like parts throughout. The present invention provides a battery testing/charging system including an integrated receptacle configured to removably receive a supplemental power unit, such as a booster pack. The supplemental power unit is capable of providing power to an execution unit capable of performing battery-related functions, such as a battery tester/charger. This configuration provides the operator of the system with a single tool capable of operation even in remote locations.

Figure 1:
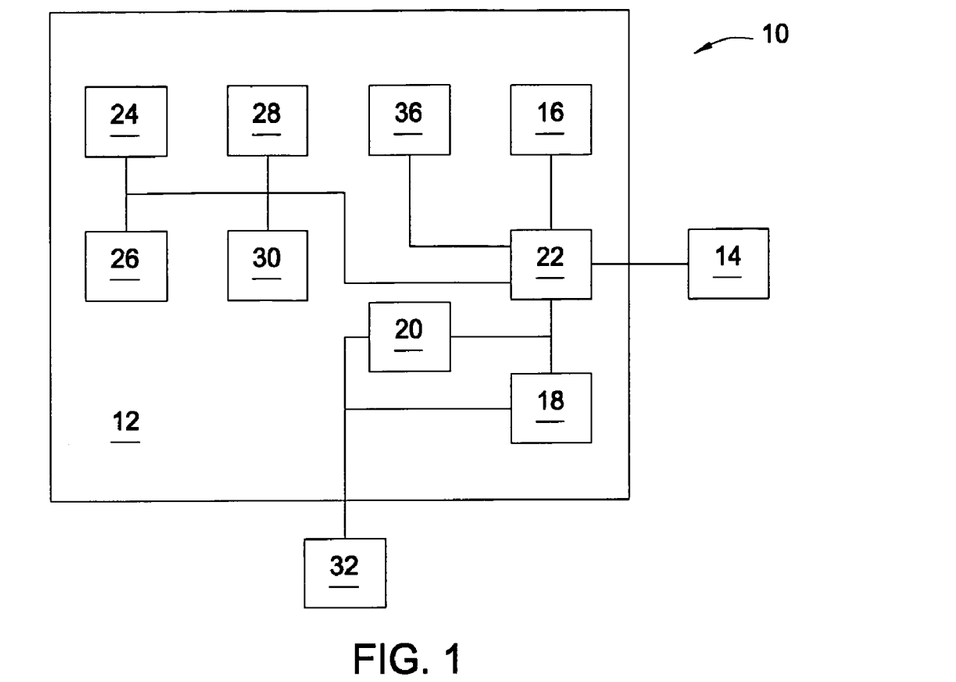
FIG. 1 is an exemplary block diagram of a software-driven system incorporating a user interface according to one embodiment of the present invention.

A block diagram of an exemplary software-driven system 10, such as a battery testing/charging system, is presented at FIG. 1. It should be understood that software-driven system 10 may also be a battery testing system, a battery charging system, or any other software-driven system without departing from the spirit and scope of the present invention. Software driven system 10 generally includes a user interface 12 and an execution unit 14, for example a battery tester/charger.

User interface 12 generally includes a switch 16, a database 18, a correlation software module 20, and a controller 22. User interface 12 may also include one or more of a display 24, function keys 26, a printer 28, and optical indicators 30. A source 32, which will be further described below, may also be provided.

Execution unit 14, switch 16, database 18, and correlation software module 20 are in communication with controller 22. It will be apparent to one skilled in the art and by practicing the invention that database 18 and correlation software module 20 may be embedded within controller 22. In some embodiments, controller 22 is also in communication with display 24, keys 26, printer 28, and optical indicators 30.

Switch 16 is selectable between a plurality of discrete positions. That is, switch 16 will "click" into particular, predetermined positions. It may be a knob, though other forms of switch 16, such as sliders, may be utilized without departing from the spirit or scope of the present invention. The use of a switch 16 selectable between a plurality of discrete positions provides the user with a desirable and familiar measure of tactile feedback (the feeling of switch 16 "clicking" into place, as in a mechanical system) as positions are selected. The discrete positions of switch 16 correspond, on a one-to-one basis, with functions within database 18. That is, for any given discrete position of switch 16, there is one, and only one, corresponding entry within database 18, such that placing switch 16 in a particular one of the plurality of positions identifies only a single entry within database 18. Some of the discrete positions of switch 16 may be open positions, which are positions that are not presently intended or desired to result in the performance of any operations. Thus, switch 16 allows a user to select a function from within database 18. The number of discrete positions of switch 16 will depend upon the nature of software-driven system 10 and the resolution of the hardware selected as switch 16 (i.e., the finer the resolution of switch 16, the more discrete positions available to switch 16, and thus the more functions capable of direct selection).

Database 18 is populated by entries reflecting functions performable by execution unit 14. A single entry within database 18 may combine more than one operation performable by execution unit 14. Further, database 18 may include null entries, wherein execution unit 14 will perform no function. The inclusion of null entries within database 18 and open positions of switch 16 permits the addition of functions to database 18 without necessarily requiring hardware upgrades to user interface 12.

Correlation software module 20 contains software configured to correlate the discrete positions of switch 16 to functions within database 18 on the above-described one-to-one basis. Thus, correlation software module 20 enables identification of a particular function within database 18 that a user has selected via the positioning of switch 16. Null entries within database 18 are correlated with the open positions of switch 16. Where applicable, the particular function corresponding to the selected discrete position is passed from controller 22 to execution unit 14 for execution. User interface 12 and execution unit 14 may be integrated, or, as further described below, separate components of software driven system 10.

Both database 18 and correlation software 20 are updatable and upgradeable via a source 32 in communication therewith. In some embodiments, source 32 also serves to initially load database 18 and correlation software 20. To these ends, both database 18 and correlation software 20 are stored in a rewritable medium. In some embodiments, the rewritable medium is a flash memory module, though other rewritable media, including, but not limited to, magnetic media, such as hard disk drives, and optical media, such as CD- or DVD-ROM discs, are regarded as within the scope of the present invention.

Source 32 may be a computing device, such as a laptop computer, a desktop computer, a handheld computer, a corporate network, the Internet, or any other appropriate source. Further, source 32 may also be a memory module, such as a compact flash memory module, containing update information. Upgradeability provides flexibility to match user interface 12 with a wide variety of execution units 14. Thus, as functions are added to database 18, or as the functions within database 18 are changed to reflect differing execution units 14, appropriate entries may also be made to correlation software module 20 correlating the new or additional functions within database 18 to discrete positions of switch 16.

Figure 2:
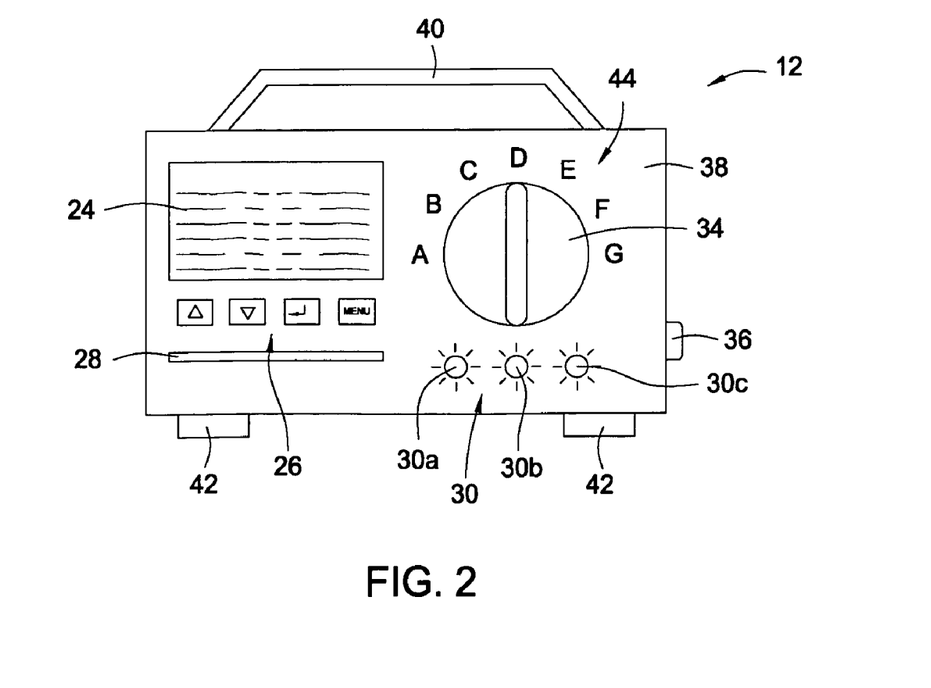
FIG. 2 is a front view of an embodiment of a user interface.

FIG. 2 is a front view of a user interface 12 according to one embodiment of the present invention. Switch 16, which, in this embodiment, is a knob 34, display 24, function keys 26, printer 28, optical indicators 30 (30a, 30b, 30c), and a communications interface 36 are integrated into a head unit or control panel 38. In some embodiments, control panel 38 includes a handle 40 for portability, and may also include feet 42 to support control panel 38 on a surface in free-standing configurations described herein. Control panel 38 may be made of any suitable material, including metals or plastics.

Controller 22 is housed within control panel 38. In some embodiments, the rewritable medium storing database 18 and correlation software module 20 is also housed within control panel 38. That is, user interface 12 is effectively self-contained within control panel 38. It should be apparent from this disclosure, however, that one or both of database 18 and correlation software module 20 may also be located remote from control panel 38. For example, database 18 and correlation software module 20 may be stored in a server computer connected via wired or wireless communications to controller 22.

Communications interface 36 enables communication between user interface 12 (i.e., control panel 38) and execution unit 14 within software-driven system 10. Communications interface 36 may also facilitate communication between source 32 and either or both of database 18 and correlation software 20. Further, where one or more of database 18 and correlation software 20 are remote from control panel 38, communications interface 36 may enable communication between controller 22 and the remote location. Communications interface 36 may use any suitable communications protocol, including wireless communications protocols, and will take a physical form corresponding to the selected communications protocol (i.e., a USB port for USB protocols; a wireless antenna for wireless protocols).

In order to assist the user in matching the discrete positions of switch 16 with their respective functions, indicia 44, such as letters A through G in FIG. 2, may be provided on the face of control panel 38. Indicia 44 both furnish the user with a menu of functions within database 18 and provide the user with immediate visual confirmation of the selected function.

In embodiments, indicia 44 are generic labels for the various discrete positions of switch 16. Generic labels, however, may require an additional resource, such as a reference sheet, to enable the user to clearly identify the function associated with a particular, non-descriptive label. To mitigate the need for this additional resource, indicia 44 may be specific to the entries within database 18. In such embodiments, indicia 44 specifically identify the functions within database 18, for example by name (i.e., the labels SYSTEM TEST, TEST/AUTO CHARGE, BOOST, FAST CHARGE, SLOW CHARGE, TRICKLE CHARGE in a battery testing/charging system), at the corresponding positions of switch 12. Such specific indicia 44 improve the visual feedback provided the user via positive confirmation of the selected function.

Indicia 44 may be permanently affixed to the face of control panel 38, for example by etching indicia 44 directly thereinto or by printing indicia 44 directly thereon. Alternatively, indicia 44 may be provided on removable and interchangeable templates or decals. Where removable and interchangeable templates or decals are used, indicia 44 may be quickly and easily updated to reflect changes made within database 18. That is, as database 18 is updated or upgraded, for example to reflect the functions of a different execution unit 14, indicia 44 may be replaced as well, limited only by the number of discrete positions of switch 16.

Display 24 and function keys 26 may operate in conjunction to allow the user access to lower level and additional functions beyond those directly accessible via switch 16. Display 24 may be a four-line LCD display that provides information to the user regarding the state of software-driven system 10. In some embodiments, function keys 26 provide up, down, enter, and menu functionality. Alternatively function keys 26 may be soft keys, with functions dependent upon the instantaneous state of software-driven system 10. Such state-dependent functions may be shown on display 24 proximate respective function keys 26. It should be understood that, in embodiments, one or more of display 24 and function keys 26 may be separate from control panel 38 rather than integrated thereinto.

In addition to accessing lower level functions, function keys 26 may be used to select an operative database 18 from a plurality of databases 18. This multiplies the number of functions directly selectable via switch 16. For example, function keys 26 may be usable to switch between a first database 18 of automatic functions and a second database 18 of manual functions. Within each database 18, switch 16 selects individual functions as described above. Thus, the combination of switch 16 with function keys 26 effectively doubles the number of functions directly accessible via switch 16. Display 24 and function keys 26 may also be used to provide additional input to software-driven system 10 required by the function selected via switch 16. For example, display 24 may show, and function keys 26 may be used to adjust and confirm, a duration for a battery charging function selected via switch 16.

Display 24, printer 28, or both may provide output information to the user. For example, the function selected via switch 16 may be mirrored or confirmed on display 24. In some embodiments, printer 28 is not integrated directly into control panel 38, but rather is an external device attached thereto, for example via communications interface 36. Optical indicators 30 furnish the user with information regarding the operational state of software-driven system 10. In certain embodiments of the invention, optical indicators 30 provide information regarding the state of execution unit 14. In some embodiments, optical indicators 30 are tri-colored light emitting diodes (LEDs) 30a, 30b, 30c, in which a green LED indicates that execution unit 14 has completed the function selected via switch 16, a yellow LED indicates that execution unit 14 is performing the function, and a red LED indicates an error or fault. These LEDs may be provided individually or, in embodiments, incorporated into a single lens. To ensure that optical indicators 30 are visible from a distance, it is desirable for them to be bright and of at least ¼" diameter.

Figure 3:
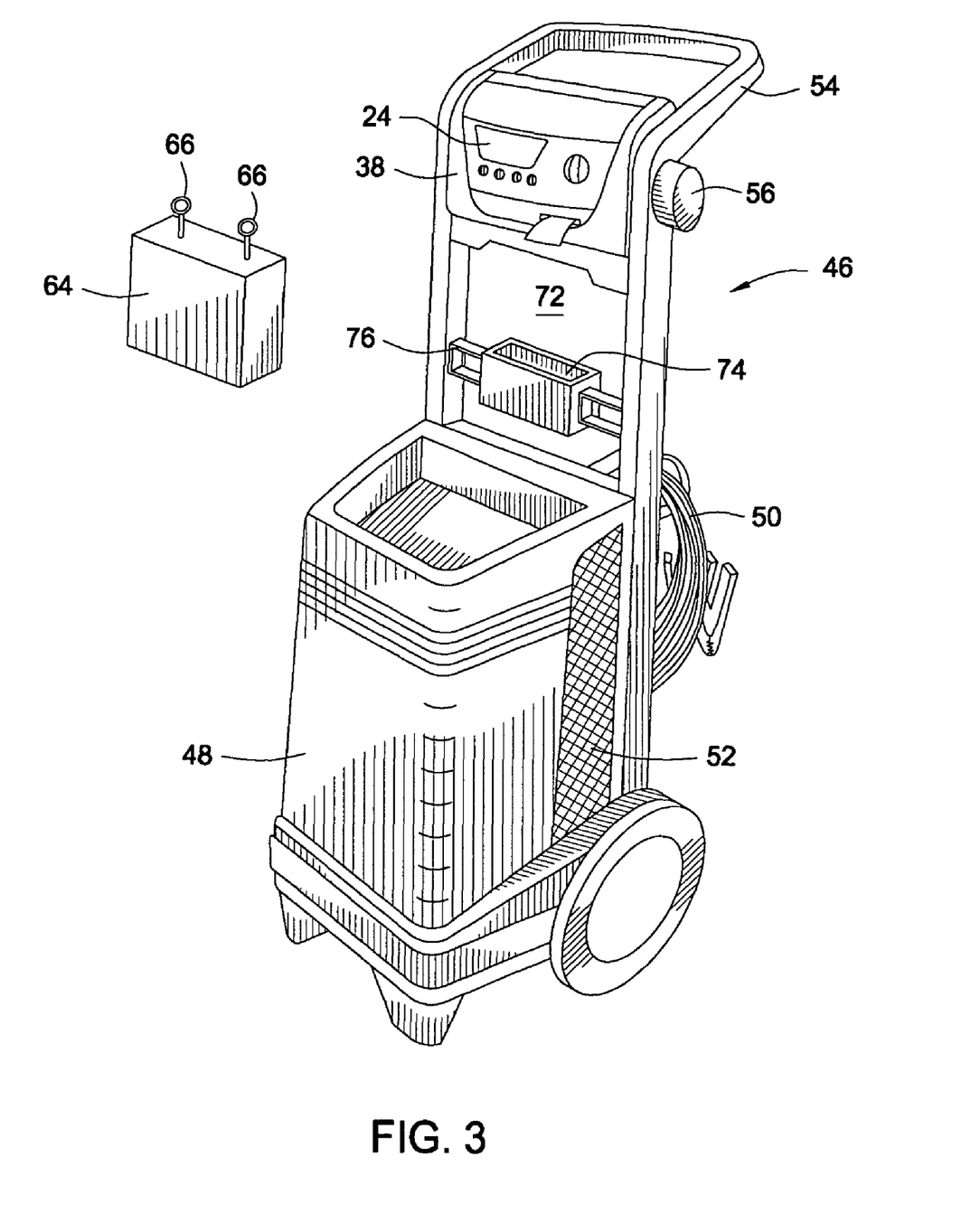
FIG. 3 illustrates a software-driven battery testing/charging system incorporating a remote control panel according to an embodiment of the invention.

FIG. 3 illustrates a software-driven battery testing/charging system 46 according to an embodiment of the present invention. Battery testing/charging system 46 includes a battery tester/charger 48 and a control panel 38. It should be understood from this disclosure that battery tester/charger 48 may be replaced by a battery charger or any other device capable of performing at least one battery-related function. Cabling 50 is provided to attach battery tester/charger 48 to a battery (not shown) to be tested and/or charged. Battery testing/charging system 46 also includes a power source (not shown) to power the components therein.

By way of example, and without limitation, battery tester/charger 48 is capable of executing at least some of the following functions, selectable via switch 16 on control panel 38 attached to battery tester/charger 48:

SYSTEM TEST: Battery testing/charging system 46 will guide the user through battery construction and capacity selection via control panel 38. The test, which is automated, will test the battery, starter, and charging system. Actual test current will be determined based on the state of charge of the battery.

TEST/AUTO CHARGE: The user will be prompted, for example via display 24, to enter battery chemistry and capacity, for example by using function keys 26. Battery testing/charging system 46 will then test and charge the battery to which it is attached.

BOOST: This function provides cranking assist in the case of a discharged battery.

FAST CHARGE: The user will be prompted to enter battery chemistry and minutes to charge. Battery testing/charging system 46 will calculate, based on the state of charge of the battery, how much current to apply to charge the battery in the time frame specified by the user.

SLOW CHARGE: This function is similar to FAST CHARGE, but limits the current to a lower maximum value, and in some embodiments of the invention to 15A.

TRICKLE CHARGE: This function is used to maintain a battery over a period of time.

Control panel 38 is remotely connected to and in operable communication with battery tester/charger 48, such as via communications interface 36. The connection between control panel 38 and battery tester/charger 48 may be wired or wireless. User input to control panel 38, such as the function selected via switch 16, may be communicated to battery tester/charger 48. Similarly, information may be communicated from battery tester/charger 48 to control panel 38, such as for output on display 24. For example, during a charging function (i.e., FAST CHARGE, SLOW CHARGE, or TRICKLE CHARGE), display 24 may show time remaining, voltage, and charge current.

Battery tester/charger 48 is mounted on a cart 52 for mobility and portability. Cart 52 includes an ergonomically-shaped handle 54 to facilitate movement of battery tester/charger 48 to various locations, for example between service bays in an automobile service center. Control panel 38 is mounted to handle 54 in an ergonomically-suitable position (i.e., high enough that the user need not bend or stoop to actuate switch 16 and at a suitable angle for viewing the face of control panel 38). Where a wired connection exists between control panel 38 and battery tester/charger 48, the wire may be routed through the interior of handle 54 so as to present a more pleasing appearance.

In some embodiments of the invention, a locking mechanism, such as a knob 56, releasably secures control panel 38 in a desired, ergonomically suitable, position on handle 54. Knob 56 may be unlocked and the position of control panel 38 adjusted. Handle 54 may also be adjustable for improved ergonomics. By adjusting control panel 38 and/or handle 54, battery testing/charging system 46 can be reconfigured to meet different users' individual ergonomic needs and/or prevailing environmental conditions. For example, the angle of control panel 38 may be adjusted, either to reduce glare on the face thereof or to provide suitable viewing angles for users of differing height. By way of further example, the height of control panel 38 along handle 54 may be adjusted to accommodate users of differing height.

Figure 4:
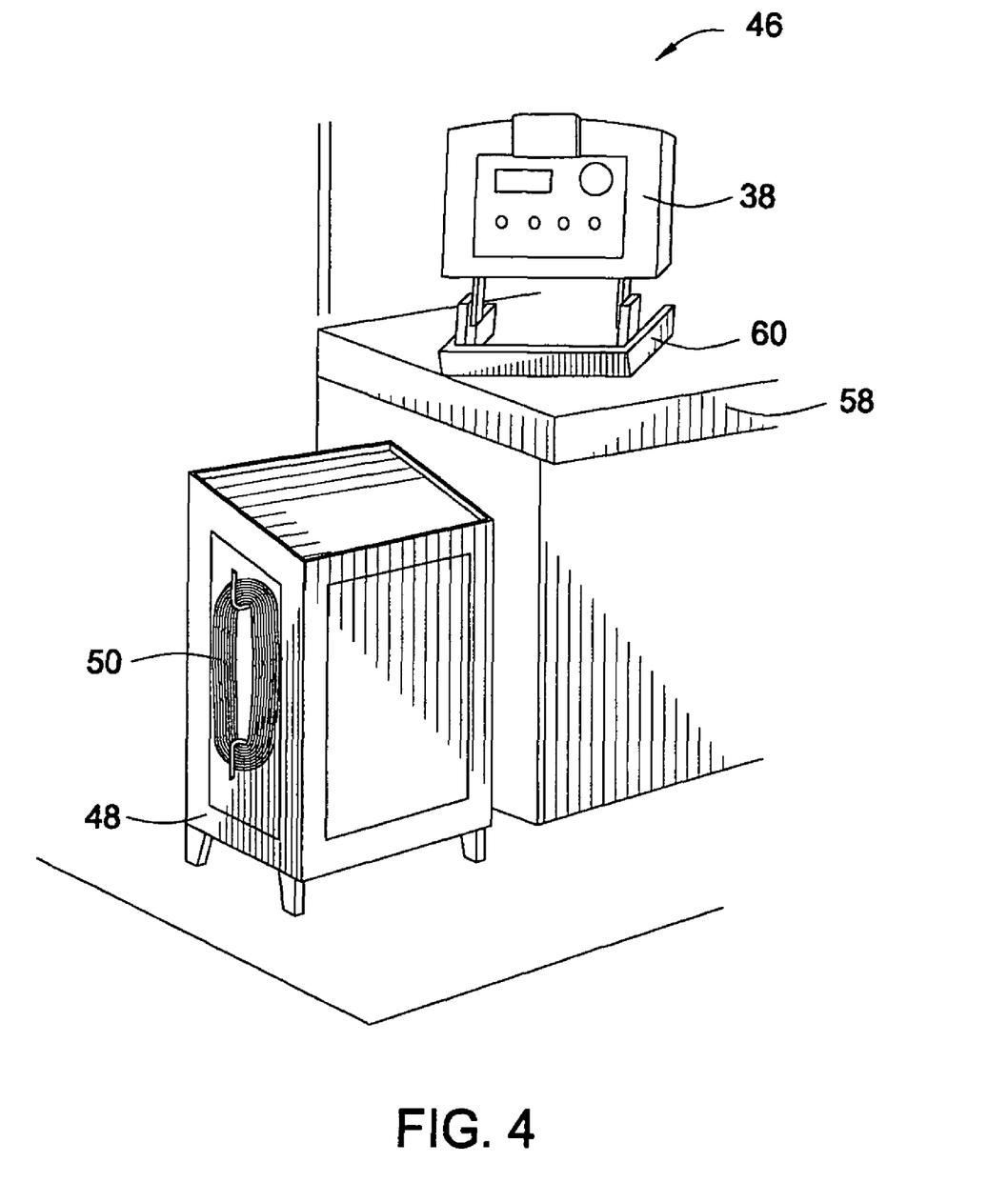
FIG. 4 shows another embodiment of a software-driven battery testing/charging system incorporating a remote control panel.
Figure 5:
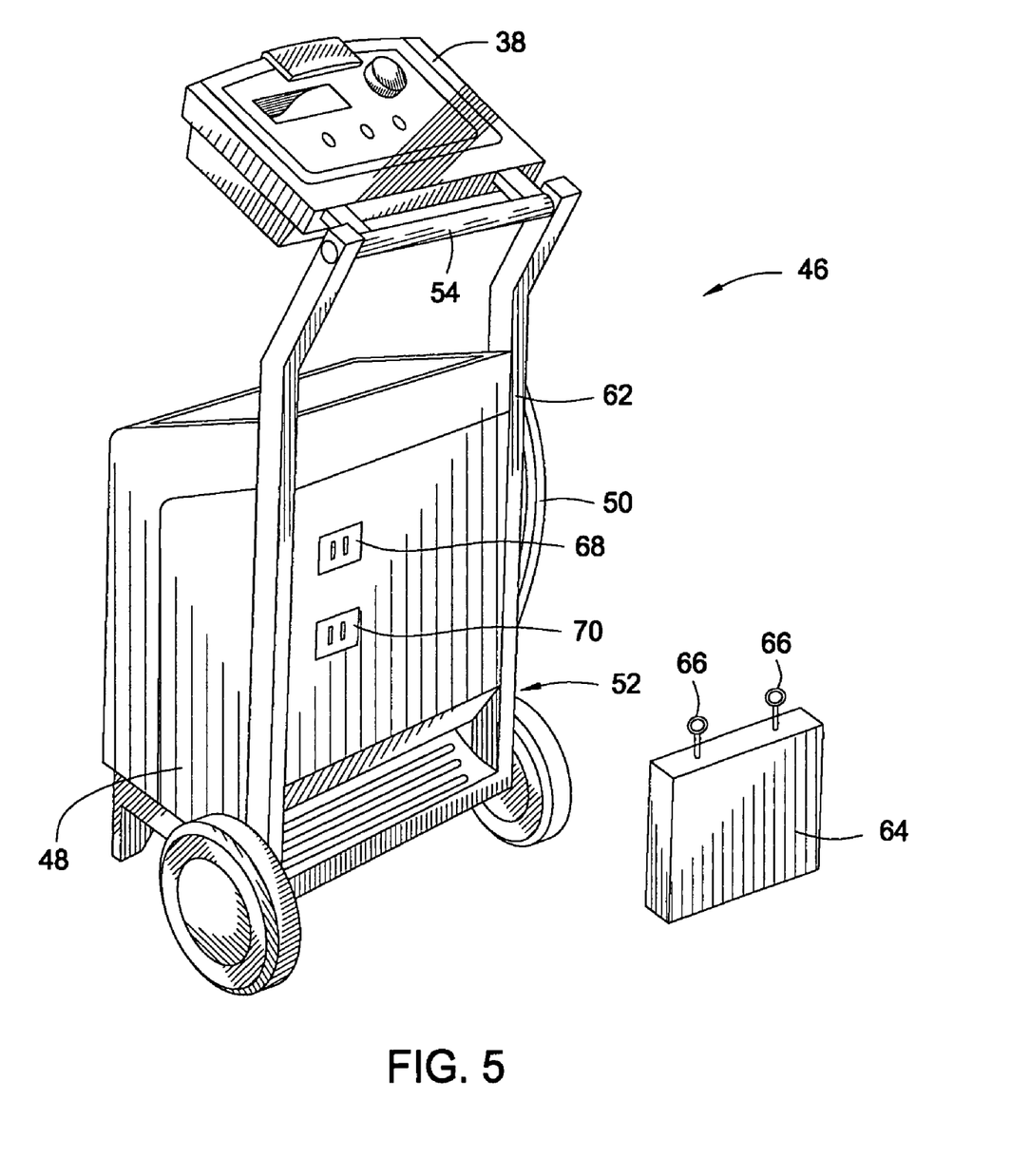
FIG. 5 shows an embodiment of a battery testing/charging system with an integrated booster pack receptacle.

FIG. 4 shows another embodiment of a battery testing/charging system 46 incorporating a battery tester/charger 48 and a remotely-positioned control panel 38. In the embodiment shown in FIG. 5, battery tester/charger 48 is in a floor-standing installation, while control panel 38 sits upon a bench or shelf 58 supported by a stand 60. The connection between control panel 38 and stand 60 may be adjustable, for example to permit angling control panel 38 within stand 60. Though FIG. 4 depicts a wireless connection between control panel 38 and battery tester/charger 48, a wired connection between the two is regarded as within the scope and spirit of the present invention, and it should be understood that the choice between wired and wireless communications depends, in part, upon the distance desired or required between control panel 38 and battery tester/charger 48. Separating control panel 38 from battery tester/charger 48 as shown in FIG. 5 permits battery tester/charger 48 to be installed in a suitably unobtrusive location while control panel 38 remains in an easily accessible location. For example, within a retail store, battery tester/charger 48 may be hidden (i.e., under a counter), thereby improving the appearance of the store and increasing usable sales floor space.

FIG. 5 illustrates an embodiment of a battery testing/charging system 46 with an integrated booster pack receptacle. System 46 may be either a software-driven system or a traditional mechanical system. The system includes a battery tester/charger 48 and a control panel 38. A receptacle, for example key shaped slots 62, configured to removably receive an external booster pack 64 is integrated into battery tester/charger 48. Alternatively, key shaped slots 62 may be integrated into cart 52 without departing from the spirit and scope of the present invention. Booster pack 64 may be suspended from key shaped slots 62 via hangers 66 attached to booster pack 64. In some embodiments, booster pack 64 is a vehicle booster pack, though other types of booster devices, such as battery boosters with air compressors, are contemplated as within the scope and spirit of the instant invention.

An outlet 68 is integrated into battery tester/charger 48, and charges (or recharges, as applicable) booster pack 64 when booster pack 64 is plugged into outlet 68. This may be accomplished, for example, by providing outlet 68 with pass-through power from the power source (not shown) powering battery testing/charging system 46.

Battery tester/charger 48 may receive full or partial power from booster pack 64 through an auxiliary power input 70. This is desirable, for example, when battery testing/charging system 46 is connected to a vehicle battery remote from a fixed power source (i.e., an AC power outlet), such as when the battery is installed in a disabled vehicle in a parking lot.

Returning now to FIG. 3, a cart 52-integrated receptacle, shaped opening 72, is shown. Booster pack 64 is constructed and arranged such that, when mounted within shaped opening 72, a friction fit exists between cart 52 and booster pack 64. This friction fit releasably secures booster pack 64 to cart 52. It should be understood that other receptacles, such as a compartment within battery tester/charger 48, are also regarded as within the spirit and scope of the present invention.

In some embodiments, an accessory storage compartment 74 is mounted to cart 52, for example by hanging accessory storage compartment 74 from handle 54. Further, a bracket 76, configured to support an output device such as printer 28, may also be provided on cart 52.

In use, battery tester/charger 48 and booster pack 64 may be transported together, using cart 52, to any desired location. If this location is remote from a fixed power supply, battery tester/charger 48 may be powered from booster pack 64. Thus, battery tester/charger 48 need not have an internal battery or battery charging circuitry.

Alternatively, where only booster pack 64 is required, booster pack 64 may be removed from battery testing/charging system 46 and carried to the test location. Thus, in addition to providing an integrated battery testing/charging system usable even in remote locations, the present invention provides a convenient storage system for many components useful in a battery testing/charging system.

The many features and advantages of the invention are apparent from the detailed specification, and thus, it is intended by the appended claims to cover all such features and advantages of the invention which fall within the true spirit and scope of the invention. Thus, although the various aspects of the invention have been described in the context of software-driven battery testing/charging systems, it should be understood that the principles of the present invention are equally applicable to any software-driven system. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A battery testing/charging system, comprising:
an execution unit capable of performing at least one battery-related function;
a receptacle configured to receive an external booster pack;
a first outlet integrated and positioned on an outside surface of the execution unit, the first outlet configured to power said booster pack when said booster pack is connected to said first outlet;
a second outlet integrated and positioned on the outside surface of the execution unit, the second outlet configured to be directly coupled to and receive power from said booster pack when said booster pack is connected to said second outlet and;
a cart, wherein said receptacle is integrated with said cart, wherein said execution unit is configured to receive power from said booster pack, and
wherein said booster pack provides supplemental power to said execution unit.

2. The battery testing/charging system of claim 1, wherein said receptacle removably receives said external booster pack.

3. The battery testing/charging system of claim 1, wherein said booster pack comprises a vehicle battery booster pack.

4. The battery testing/charging system of claim 1, wherein said receptacle is integrated with said execution unit.

5. The battery testing/charging system of claim 4, wherein said receptacle comprises a slot in said execution unit and wherein said booster pack is suspendable from said slot via a hanger attached to said booster pack.

6. The battery testing/charging system of claim 1, wherein said receptacle comprises a shaped opening defined by said cart, said shaped opening formed to achieve a friction fit with said booster pack when said booster pack is mounted within said shaped opening.

7. The battery testing/charging system of claim 1, further comprising an accessory storage compartment mounted to said cart.

8. The battery testing/charging system of claim 1, further comprising a bracket mounted to said cart, wherein said bracket is configured to support an output device.

9. The battery testing/charging system of claim 1, wherein said second outlet comprises a pass-through from a power source attached to said execution unit.

10. A portable battery testing/charging system, comprising:
means for executing configured to execute at least one battery-related function;
means for providing power configured to provide power to at least one of said executing means and a vehicle battery;
means for transporting configured to transport said executing means and said power providing means;
means for removably securing configured to secure said power providing means to one of said executing means and said transporting means;
means for charging integrated and positioned on an outside surface of the executing means, the charging means configured to charge said power providing means when said power providing means is connected to said charging means;
means for discharging integrated and positioned on the outside surface of the executing means, the discharging means configured be directly coupled to and to provide power from said power providing means when said power providing means is connected to said discharging means; and
means for moving the testing/charging system, wherein said means for providing power is integrated with said means for moving the testing/charging system,
wherein said means for executing is configured to receive power from said vehicle battery, and
wherein said vehicle battery provides supplemental power to said means for executing.

11. The modular battery testing/charging system of claim 10, further comprising means for carrying one or more additional components.

12. A method of diagnosing a battery in a vehicle at a location remote from a fixed power supply, the method comprising:
providing an execution unit capable of performing at least one battery-related function and first and second outlets integrated and positioned on an outside surface of the execution unit;
providing a portable power supply; and providing supplement power from the portable power supply to the execution unit;
mounting the execution unit to a transportation device;
releasably securing the portable power supply to a receptacle integrated into one of the execution unit and the transportation device, the portable power supply being connected to the first outlet and directly coupled to the second outlet; and
performing a battery-related function.

13. The method of claim 12, further comprising:
connecting the portable power supply to a power input of the execution unit; and
connecting the execution unit to the battery.

14. The method of claim 13, wherein performing a battery-related function comprises performing a battery-related function using the execution unit under power provided by the portable power supply.

15. The method of claim 12, further comprising:
connecting the execution unit to the fixed power supply;
connecting the portable power supply to an outlet integrated into the execution unit; and
charging the portable power supply from the fixed power supply.

16. The method of claim 12, wherein the step of performing a battery-related function comprises:
connecting the portable power supply to the battery; and
boosting the vehicle battery such that the vehicle may be started.

* * * * *